(12) United States Patent
Lin et al.

(10) Patent No.: US 10,748,612 B1
(45) Date of Patent: Aug. 18, 2020

(54) SENSING CIRCUIT WITH ADAPTIVE LOCAL REFERENCE GENERATION OF RESISTIVE MEMORY AND SENSING METHOD THEREOF

(71) Applicant: NATIONAL TSING HUA UNIVERSITY, Hsinchu (TW)

(72) Inventors: Wei-Yu Lin, Taipei (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/504,351

(22) Filed: Jul. 8, 2019

(51) Int. Cl.
*G11C 11/00* (2006.01)
*G11C 13/00* (2006.01)
*G11C 7/10* (2006.01)
*G11C 7/08* (2006.01)

(52) U.S. Cl.
CPC .............. *G11C 13/004* (2013.01); *G11C 7/08* (2013.01); *G11C 7/106* (2013.01); *G11C 7/1063* (2013.01); *G11C 13/0026* (2013.01); *G11C 13/0038* (2013.01); *G11C 2013/0045* (2013.01)

(58) Field of Classification Search
CPC . G11C 13/004; G11C 13/0038; G11C 7/1063; G11C 7/08; G11C 7/106; G11C 13/0026; G11C 2013/0045

USPC ......................................................... 365/148
See application file for complete search history.

(56) References Cited

U.S. PATENT DOCUMENTS

| | | | | |
|---|---|---|---|---|
| 7,787,320 | B2* | 8/2010 | Ueda ...................... | G11C 7/062 365/185.21 |
| 8,363,499 | B2* | 1/2013 | La Rosa ................. | G11C 7/065 365/205 |
| 8,750,018 | B2* | 6/2014 | Youn ..................... | G11C 13/0007 365/148 |
| 9,177,641 | B2* | 11/2015 | Takahashi ............. | G11C 13/004 |

* cited by examiner

*Primary Examiner* — Tha-O H Bui
(74) *Attorney, Agent, or Firm* — CKC & Partners Co., LLC

(57) ABSTRACT

A sensing circuit with adaptive local reference generation of a resistive memory is configured to adaptively sense a first bit line current of a first bit line and a second bit line current of a second bit line via one sense amplifier. The sense amplifier has a first output node and a second output node. The adaptive local reference generator is electrically connected to the sense amplifier and generating a reference current equal to a sum of the second bit line current and a local reference current. A first bit line current flows through the first output node during a first bit line time interval. A second bit line current flows through the first output node during a second bit line time interval. The first bit line time interval is different from the second bit line time interval.

20 Claims, 14 Drawing Sheets

SENSING CIRCUIT WITH ADAPTIVE LOCAL REFERENCE GENERATION OF RESISTIVE MEMORY AND SENSING METHOD THEREOF

BACKGROUND

Technical Field

The present disclosure relates to a sensing circuit of a resistive memory and a sensing method thereof. More particularly, the present disclosure relates to a sensing circuit with adaptive local reference generation of a resistive memory and a sensing method thereof.

Description of Related Art

In these years, due to the industrial growth of mobile device, medical electrical equipment, portable storage, etc., requirement of memory with low power, high speed and high density is increased. However, sensing margin time of the memory is the key factor which may limit the access time of the memory. It is known to provide memory circuitry including an array of bit cells within which columns of bit cells are connected by bit line pairs. The bit line pairs are precharged to a given voltage and then one of the bit lines of the pair is discharged depending upon the contents of the bit cell within a column that is read. The difference in voltage which arises between the bit lines of the bit line pair as a result of this discharge is sensed by a sense amplifier coupled to the bit lines.

In a long bit-line length resistive memory array, developing time would be a first type of bottleneck in sensing operation since it takes lots of time to accumulate a slow-growing voltage difference between a bit-line voltage and a reference voltage. Decreasing of developing time leads to read failure because the voltage difference between the bit-line voltage and the reference voltage is smaller than an offset voltage from the sense amplifier. Furthermore, in the long bit-line length resistive memory array, energy, peak current and read power would be a second type of bottleneck in sensing operation. With the increase of bandwidth, the energy consumption and peak current rise as well. In addition, a small resistance difference between two states in the resistive memory leads to a small current sensing margin and causes low read yield. A conventional sensing circuit and a conventional sensing method thereof are power consuming with higher bandwidth and cannot tolerant process variations and the small current sensing margin. Therefore, a sensing circuit with adaptive local reference generation of a resistive memory and a sensing method thereof having the features of enhancing the sensing margin and reducing area penalty, energy, peak current and read power are commercially desirable.

SUMMARY

According to one aspect of the present disclosure, a sensing circuit with adaptive local reference generation of a resistive memory is configured to adaptively sense a first bit line current of a first bit line and a second bit line current of a second bit line. The sensing circuit with adaptive local reference generation of the resistive memory includes a sense amplifier, an adaptive local reference generator, a clamping unit and a path switching unit. The sense amplifier has a first output node and a second output node. The adaptive local reference generator is electrically connected to the sense amplifier and generating a reference current equal to a sum of the second bit line current and a local reference current. The clamping unit is electrically connected to the adaptive local reference generator. The path switching unit is electrically connected to the clamping unit, the adaptive local reference generator, the first bit line and the second bit line. The first bit line current flows through the first output node during a first bit line time interval via the sense amplifier, the adaptive local reference generator, the clamping unit and the path switching unit. The second bit line current flows through the first output node during a second bit line time interval via the sense amplifier, the adaptive local reference generator, the clamping unit and the path switching unit. The first bit line time interval is different from the second bit line time interval. The local reference current flows through the second output node during the first bit line time interval and the second bit line time interval via the sense amplifier, the adaptive local reference generator, the clamping unit and the path switching unit.

According to another aspect of the present disclosure, a sensing method of the sensing circuit with adaptive local reference generation of a resistive memory provides a voltage level applying step, a first bit line current sensing step and a second bit line current sensing step. The voltage level applying step is for applying a plurality of voltage levels to a plurality of control signals, respectively. The control signals are configured to control the sensing circuit. The first bit line current sensing step is for sensing the first bit line current of the first output node and the local reference current of the second output node according to the voltage levels of the control signals during the first bit line time interval. The second bit line current sensing step is for sensing the second bit line current of the first output node and the local reference current of the second output node according to the voltage levels of the control signals during the second bit line time interval.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
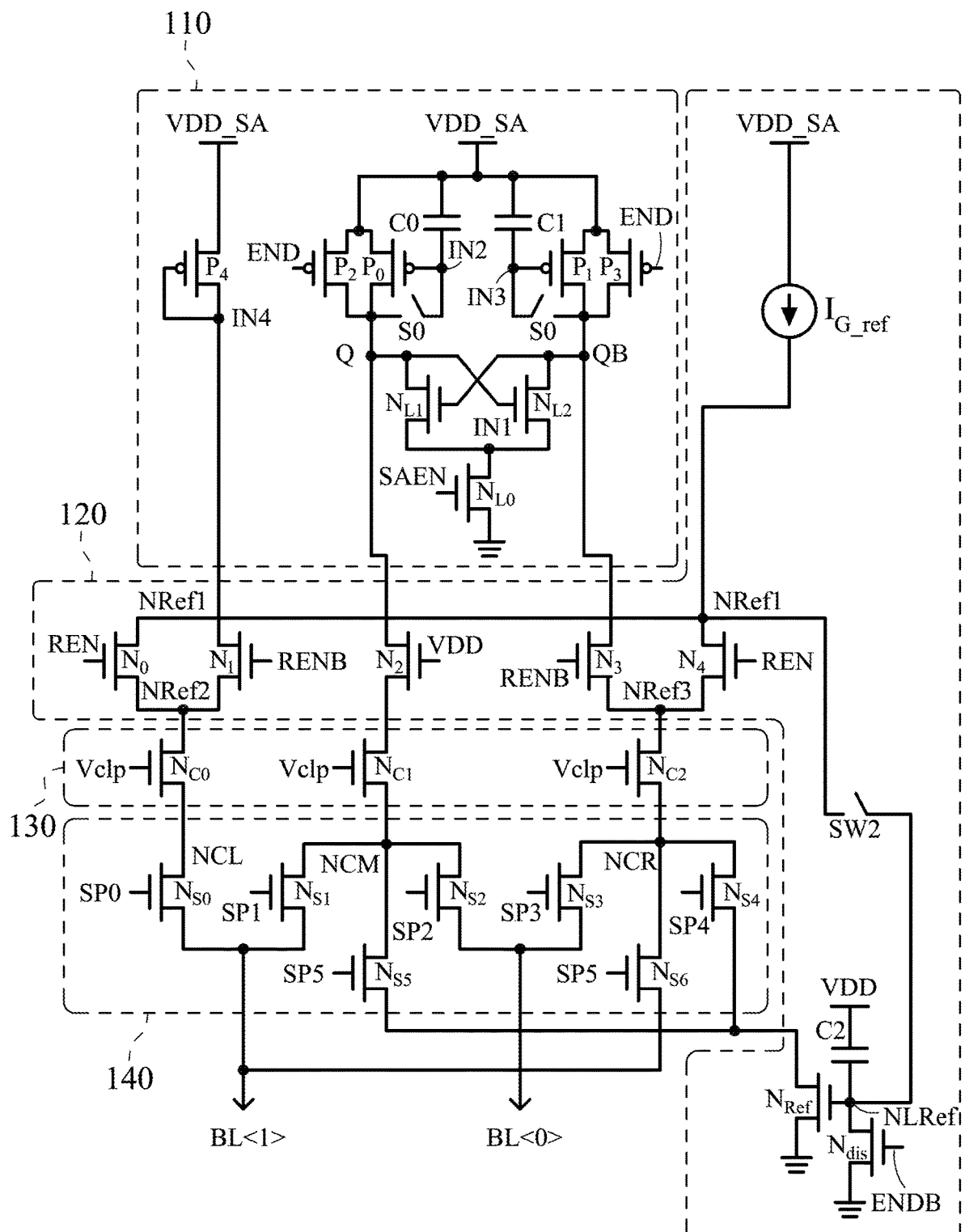
FIG. 1 shows a block diagram of a sensing circuit with adaptive local reference generation of a resistive memory according to one embodiment of the present disclosure.

FIG. 1 shows a block diagram of a sensing circuit 100 with adaptive local reference generation of a resistive memory according to one embodiment of the present disclosure. The sensing circuit 100 is configured to adaptively sense a first bit line current $I_{cell,BL<0>}$ of a first bit line BL<0> and a second bit line current $I_{cell,BL<1>}$ of a second bit line BL<1>. The sensing circuit 100 includes a sense amplifier 110, an adaptive local reference generator 120, a clamping unit 130 and a path switching unit 140.

The sense amplifier 110 has a first output node Q, a second output node QB, a first inner node IN1, a second inner node IN2, a third inner node IN3 and a fourth inner node IN4. The sense amplifier 110 includes a first sense-amplifier transistor $P_0$, a second sense-amplifier transistor $P_1$, a third sense-amplifier transistor $P_2$, a fourth sense-amplifier transistor $P_3$, a fifth sense-amplifier transistor $N_{L1}$, a sixth sense-amplifier transistor $N_{L2}$, a seventh sense-amplifier transistor $N_{L0}$, a first sense-amplifier capacitor C0, a second sense-amplifier capacitor C1, a first sense-amplifier switch, a second sense-amplifier switch and an eighth sense-amplifier transistor $P_4$. The first sense-amplifier transistor $P_0$ is connected between a sense-amplifier power supply voltage VDD_SA and the first output node Q. In one embodiment, the sense-amplifier power supply voltage VDD_SA is equal to the power supply voltage VDD. The second sense-amplifier transistor $P_1$ is connected between the sense-amplifier power supply voltage VDD_SA and the second output node QB. The third sense-amplifier transistor $P_2$ is connected between the sense-amplifier power supply voltage VDD_SA and the first output node Q. The fourth sense-amplifier transistor $P_3$ is connected between the sense-amplifier power supply voltage VDD_SA and the second output node QB. The fifth sense-amplifier transistor $N_{L1}$ is connected between the first output node Q and the first inner node IN1. The sixth sense-amplifier transistor $N_{L2}$ is connected between the second output node QB and the first inner node IN1. The seventh sense-amplifier transistor $N_{L0}$ is connected between the first inner node IN1 and a ground voltage GND. The first sense-amplifier capacitor C0 is coupled between the sense-amplifier power supply voltage VDD_SA and the second inner node IN2. The second sense-amplifier capacitor C1 is coupled between the sense-amplifier power supply voltage VDD_SA and the second inner node IN3. The first sense-amplifier switch is coupled between the second inner node IN2 and the first output node Q. The second sense-amplifier switch is coupled between the second inner node IN3 and the second output node QB. The eighth sense-amplifier transistor $P_4$ is connected between the sense-amplifier power supply voltage VDD_SA and the fourth inner node IN4.

The adaptive local reference generator 120 is electrically connected to the sense amplifier 110 and generates a reference current $I_{G\_ref}$ which is equal to a sum of the second bit line current $I_{cell,BL<1>}$ and a local reference current $I_{Loc,ref}$. In detail, the adaptive local reference generator 120 has a first reference node NRef1, a second reference node NRef2, a third reference node NRef3 and a fourth reference node NLRef. The adaptive local reference generator 120 includes a first reference transistor $N_0$, a second reference transistor $N_1$, a third reference transistor $N_2$, a fourth reference transistor $N_3$, a fifth reference transistor $N_4$, a first current mirror transistor PCM0 (shown in FIG. 3), a second current mirror transistor PCM1 (shown in FIG. 3), a reference switch SW2, a reference capacitor C2, a reset reference transistor $N_{dis}$ and a local reference transistor $N_{Ref}$. The first reference transistor $N_0$ is connected between the first reference node NRef1 and the second reference node NRef2. The second reference transistor $N_1$ is connected between the fourth inner node IN4 of the sense amplifier 110 and the second reference node NRef2. The third reference transistor $N_2$ is connected between the first output node Q of the sense amplifier 110 and the clamping unit 130. The fourth reference transistor $N_3$ is connected between the second output node QB of the sense amplifier 110 and the third reference node NRef3. The fifth reference transistor $N_4$ is connected between the first reference node NRef1 and the third reference node NRef3. In addition, the first current mirror transistor PCM0 is connected to the sense-amplifier power supply voltage VDD_SA. The second current mirror transistor PCM1 is connected between the first current mirror transistor PCM0 and the first reference node NRef1. The first current mirror transistor PCM0 and the second current mirror transistor PCM1 are configured to generate the reference current $I_{G\_ref}$. The reference switch SW2 is coupled between the first reference node NRef1 and the fourth reference node NLRef. The reference capacitor C2 is coupled between the power supply voltage VDD and the fourth reference node NLRef. The reset reference transistor $N_{dis}$ is connected between the fourth reference node NLRef and the ground voltage GND. The local reference transistor $N_{Ref}$ is connected to the fourth reference node NLRef. The first reference transistor $N_0$, the fifth reference transistor $N_4$ and the reference switch SW2 are controlled by a reference enable signal REN. The second reference transistor $N_1$ and the fourth reference transistor $N_3$ are controlled by an inverse reference enable signal RENB. The third reference transistor $N_2$ is controlled by the power supply voltage VDD. The reset reference transistor $N_{dis}$ is controlled by an inverse reset signal ENDB, and the local reference transistor $N_{Ref}$ is controlled by the fourth reference node NLRef.

The clamping unit 130 is electrically connected to the adaptive local reference generator 120. In detail, the clamping unit 130 includes a first clamping transistor $N_{C0}$, a second clamping transistor $N_{C1}$ and a third clamping transistor $N_{C2}$. The first clamping transistor $N_{C0}$ is connected between the second reference node NRef2 and the path switching unit 140. The second clamping transistor $N_{C1}$ is connected between the third reference transistor $N_2$ and the path switching unit 140. The third clamping transistor $N_{C2}$ is connected between the third reference node NRef3 and the path switching unit 140.

The path switching unit 140 is electrically connected to the clamping unit 130, the adaptive local reference generator 120, the first bit line BL<0> and the second bit line BL<1>. In detail, the path switching unit 140 has a left switching node NCL connected to the first clamping transistor $N_{C0}$, a middle switching node NCM connected to the second clamping transistor $N_{C1}$ and a right switching node NCR connected to the third clamping transistor $N_{C2}$. The path switching unit 140 includes a first switching transistor $N_{S0}$, a second switching transistor $N_{S1}$, a third switching transistor $N_{S2}$, a fourth switching transistor $N_{S3}$, a fifth switching transistor $N_{S4}$, a sixth switching transistor $N_{S5}$ and a seventh switching transistor $N_{S6}$. The first switching transistor $N_{S0}$ is connected between the left switching node NCL and the second bit line BL<1>. The second switching transistor $N_{S1}$ is connected between the middle switching node NCM and the second bit line BL<1>. The third switching transistor $N_{S2}$ is connected between the middle switching node NCM and the first bit line BL<0>. The fourth switching transistor $N_{S3}$ is connected between the right switching node NCR and the first bit line BL<0>. The fifth switching transistor $N_{S4}$ is connected between the right switching node NCR and the local reference transistor $N_{Ref}$ of the adaptive local reference generator 120. The sixth switching transistor $N_{S6}$ is connected between the middle switching node NCM and the local reference transistor $N_{Ref}$ of the adaptive local reference generator 120. The seventh switching transistor $N_{S6}$ is connected between the right switching node NCR and the second bit line BL<1>. Therefore, the sensing circuit 100 of the present disclosure utilizes one sense amplifier to sense two bit line currents, so that area penalty can be reduced, and it is suitable for a resistive type memory in high bandwidth application.

Figure 2:
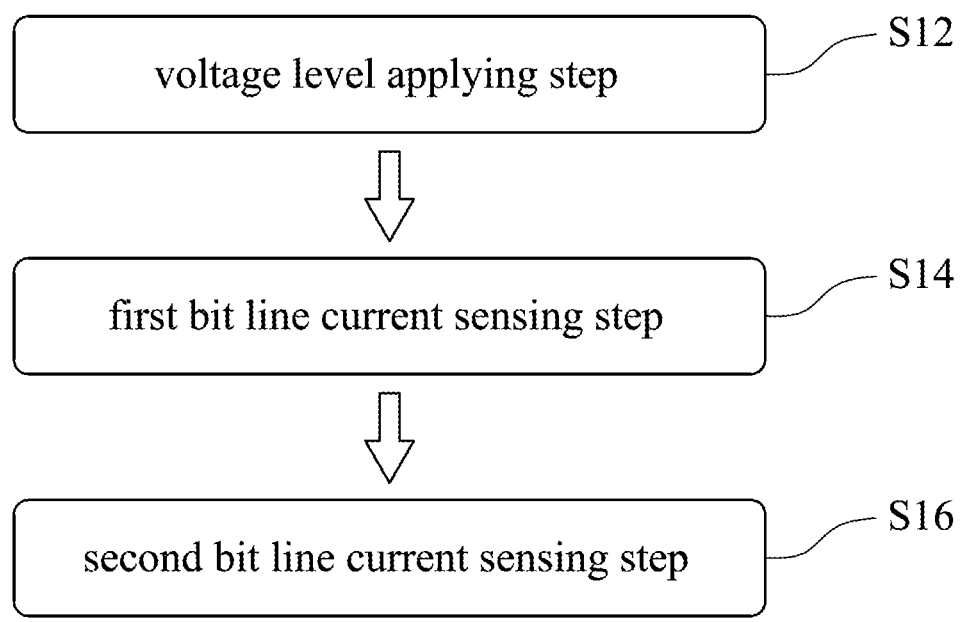
FIG. 2 shows a flow chart of a sensing method of the sensing circuit with adaptive local reference generation of a resistive memory according to another embodiment of the present disclosure.
Figure 3:
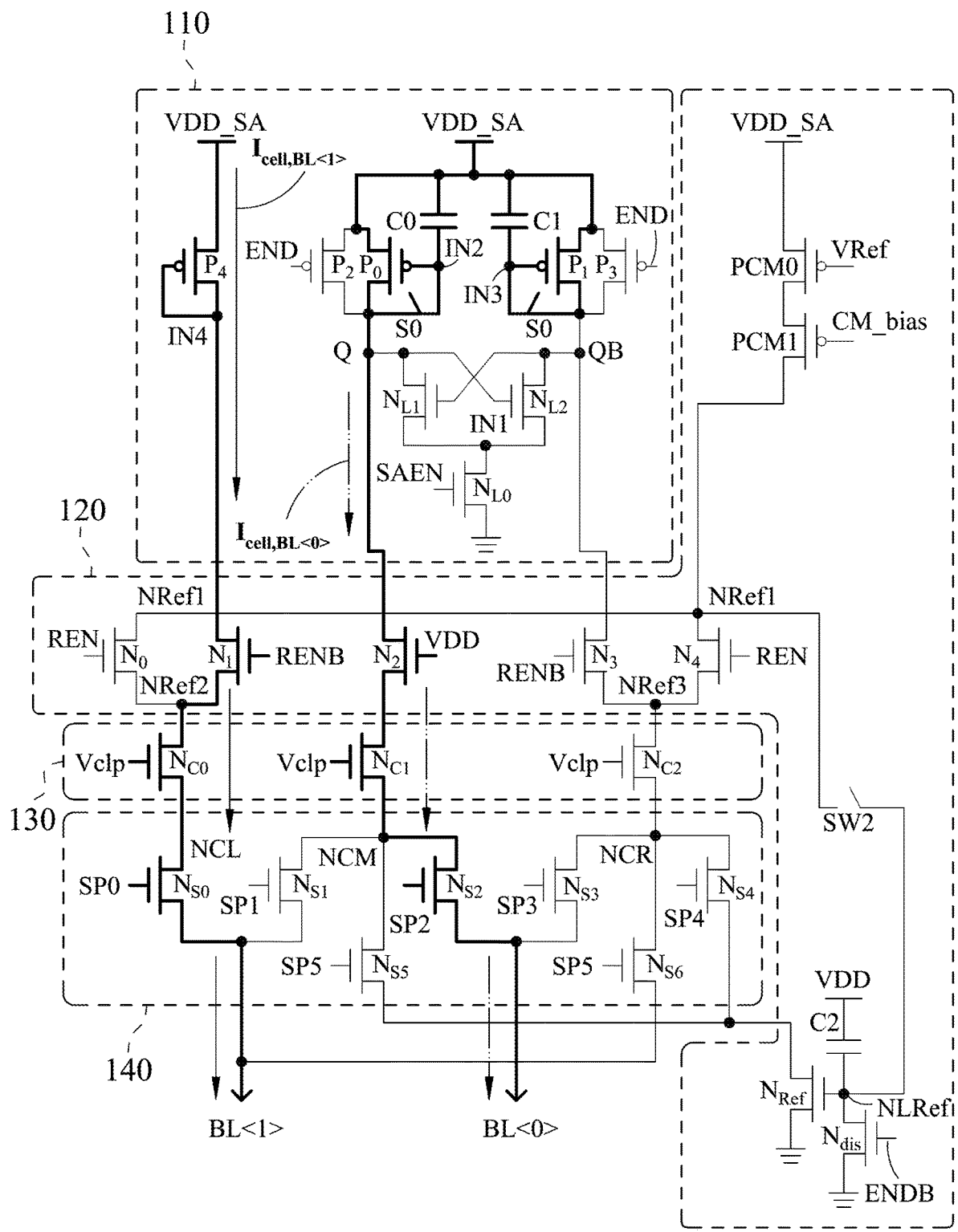
FIG. 3 shows a circuit diagram of a pre-charge operation of the sensing method of FIG. 2, during a first period of a first time interval.
Figure 4:
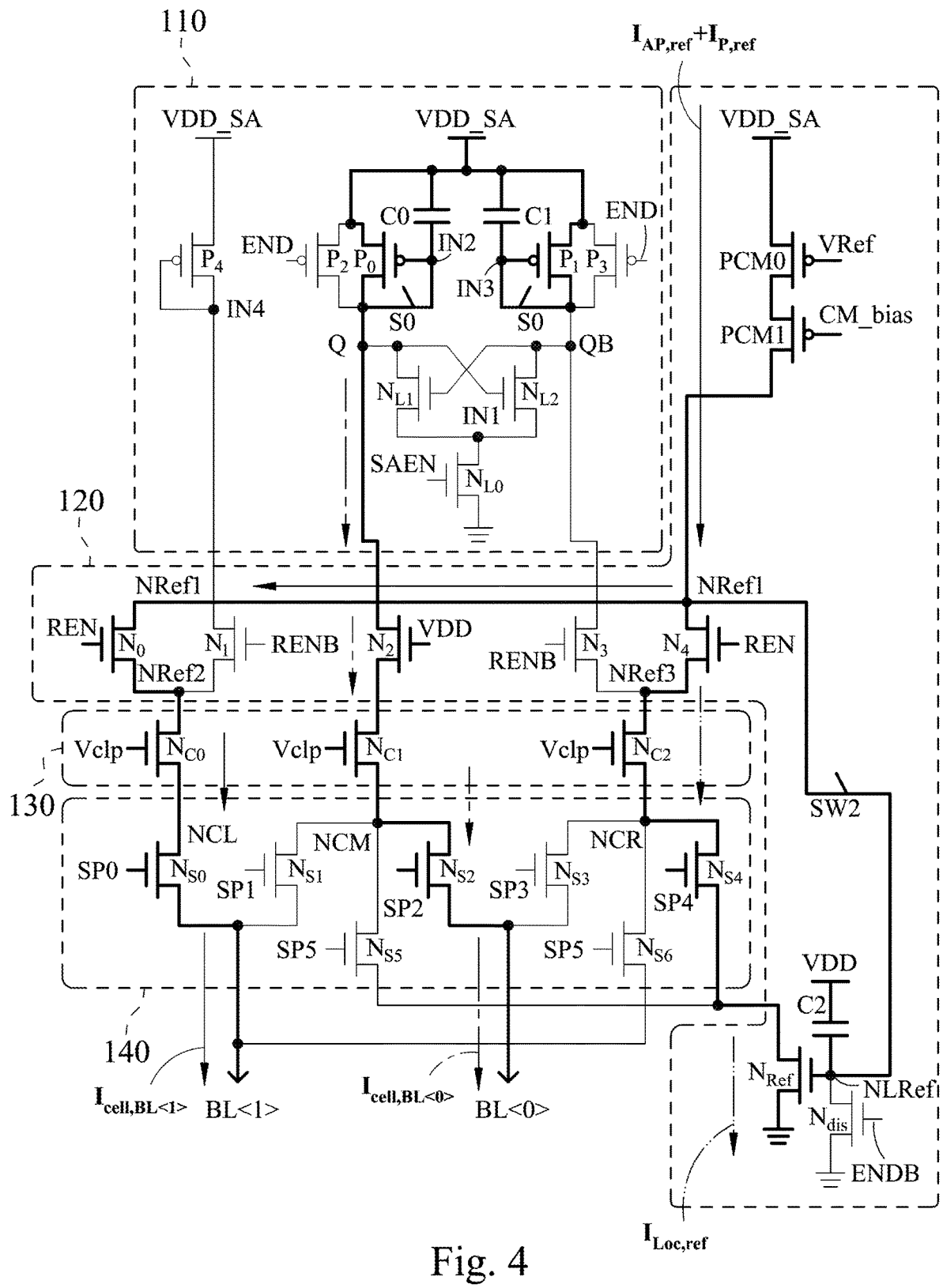
FIG. 4 shows a circuit diagram of a local reference generating operation of the sensing method of FIG. 2, during a second period of the first time interval.
Figure 5:
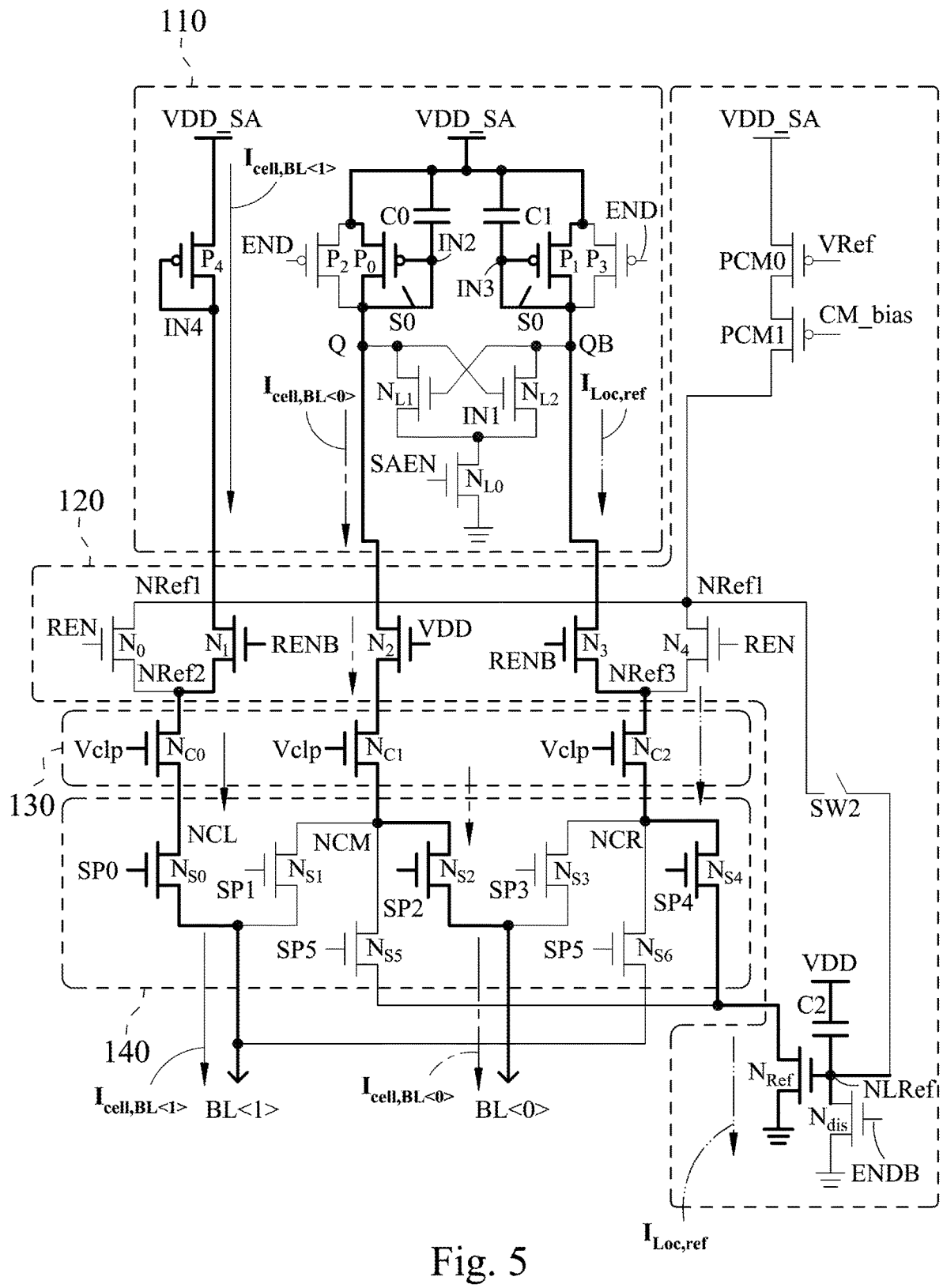
FIG. 5 shows a circuit diagram of a first bit current sampling operation of the sensing method of FIG. 2, during a second time interval.
Figure 6A:
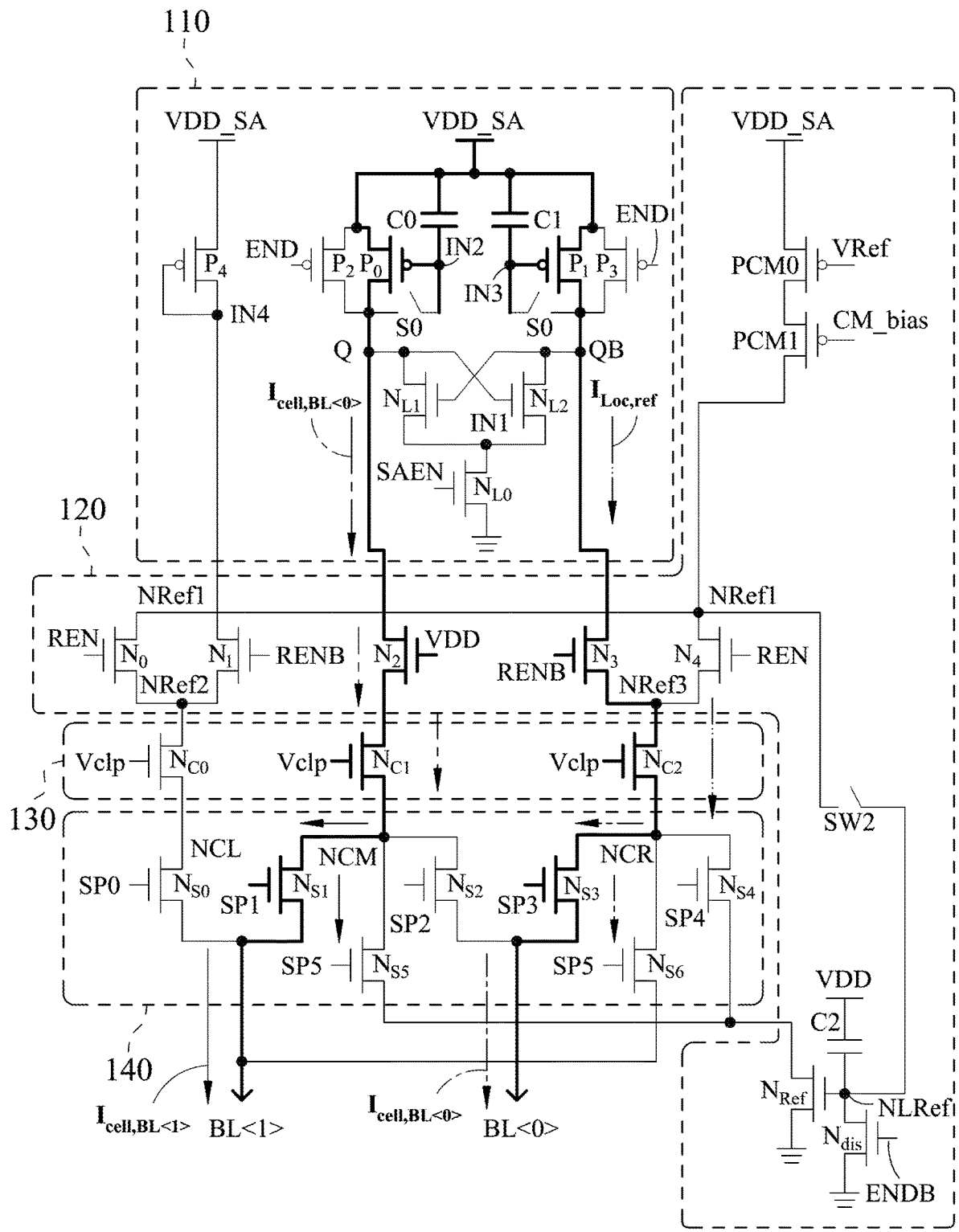
FIG. 6A shows a circuit diagram of a first bit current path switching operation of the sensing method of FIG. 2, during a third time interval.
Figure 6B:
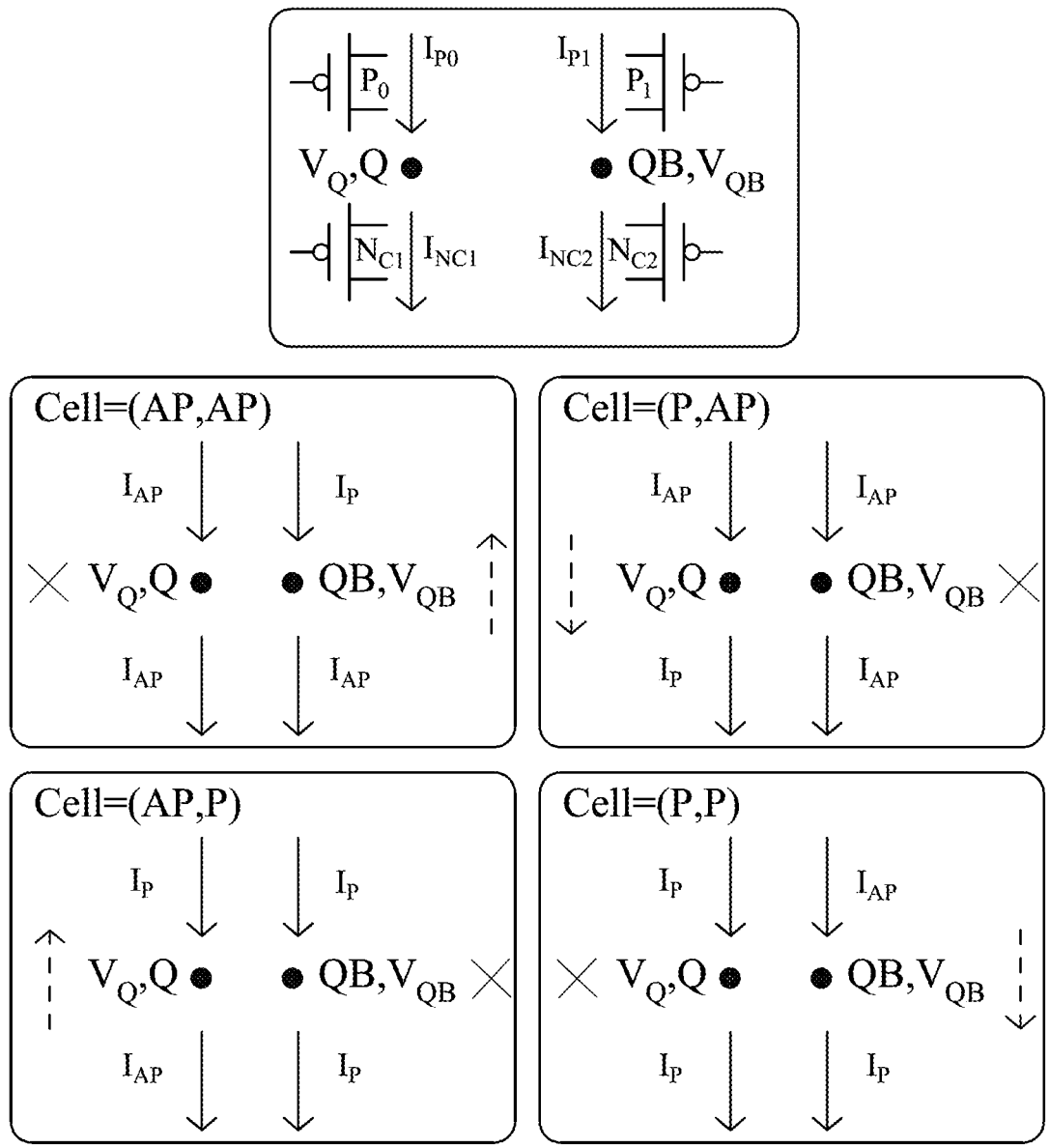
FIG. 6B shows a schematic view of variations of voltage levels of a first output node and a second output node of the sensing circuit in the first bit current path switching operation of FIG. 6A, during the third time interval.
Figure 7:
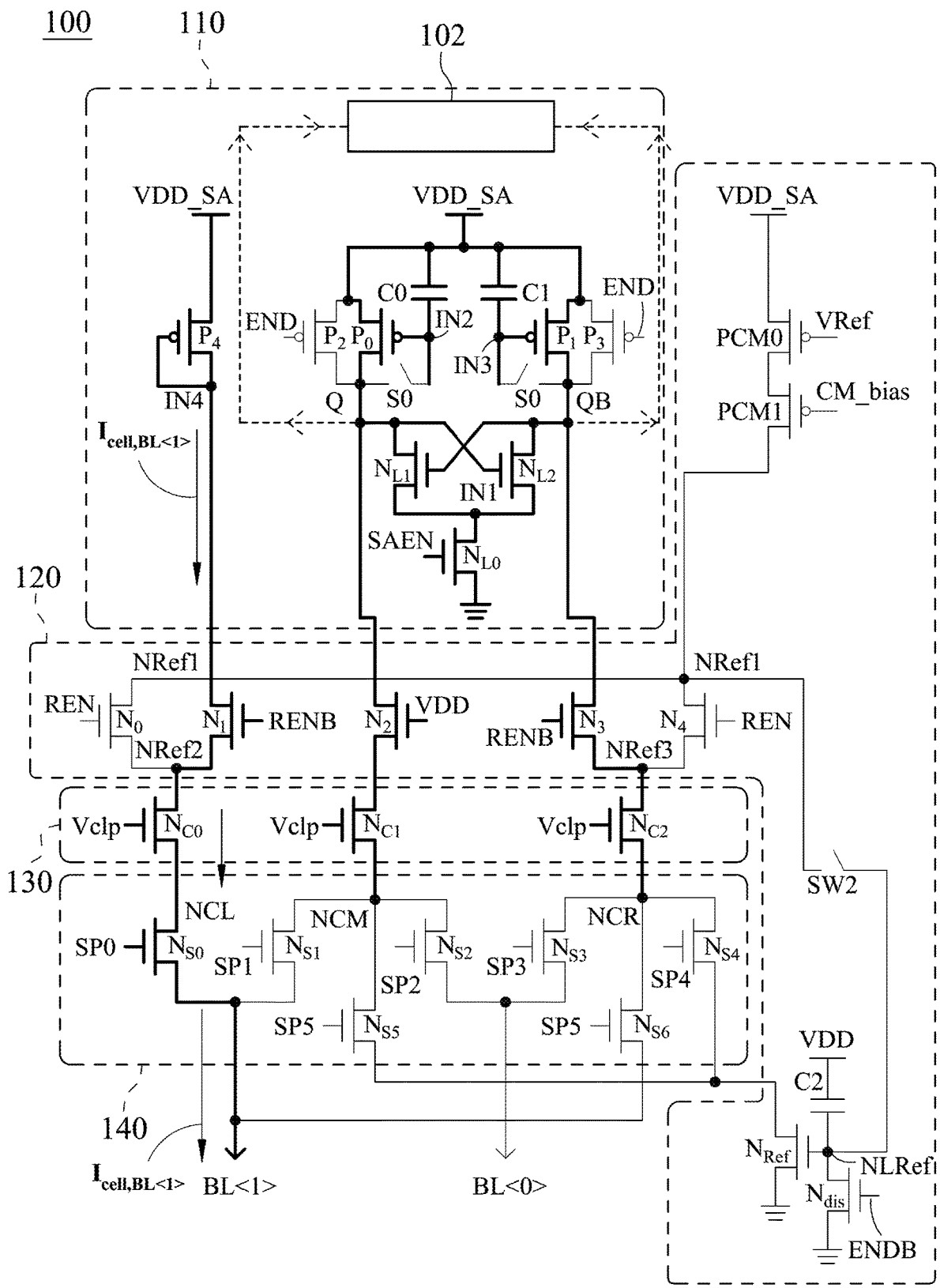
FIG. 7 shows a circuit diagram of a first bit outputting operation of the sensing method of FIG. 2, during a fourth time interval.
Figure 8:
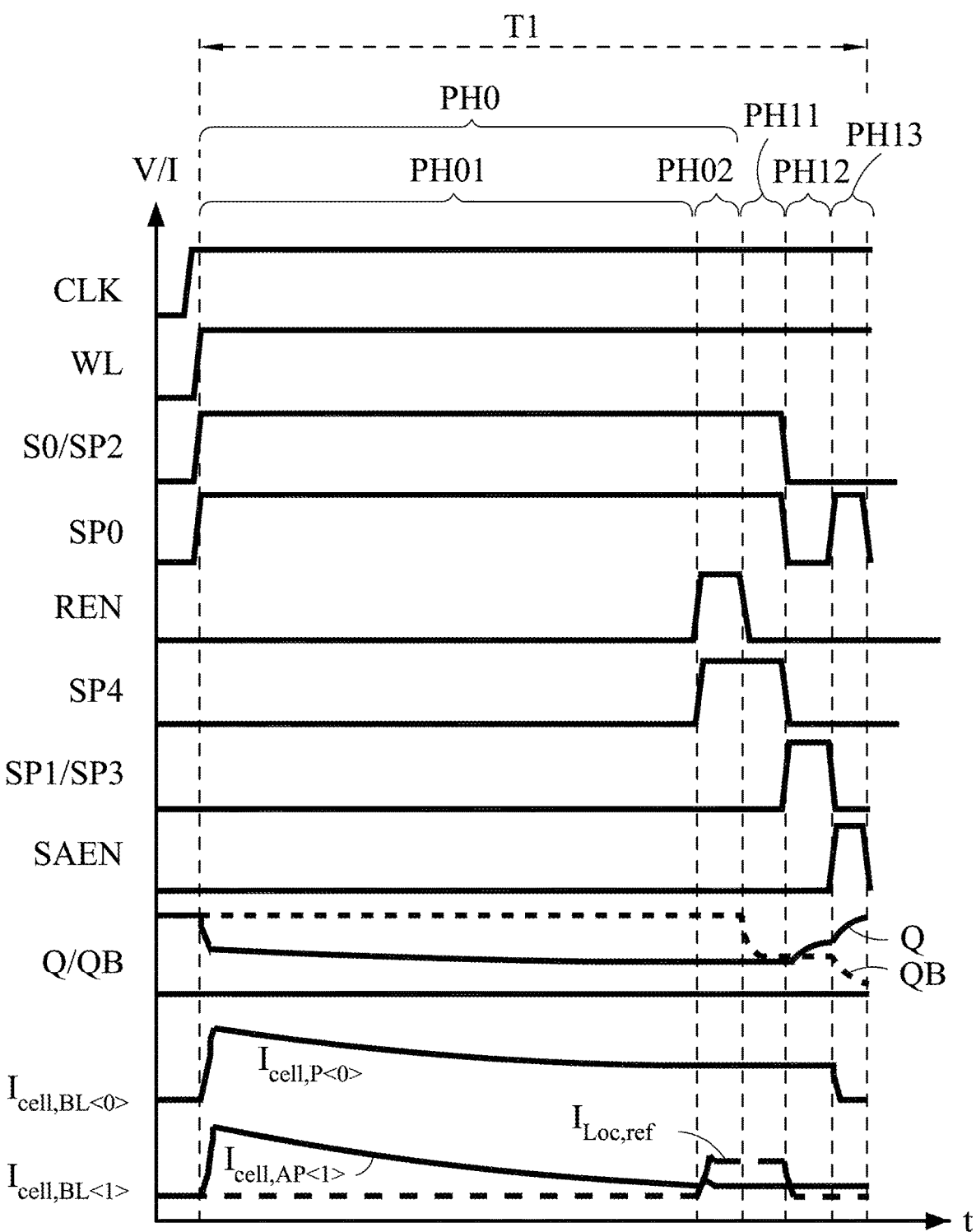
FIG. 8 shows timing diagrams of voltage levels of control signals, the first output node, the second output node, the first bit line current and the second bit line current of FIGS. 3-7.
Figure 9:
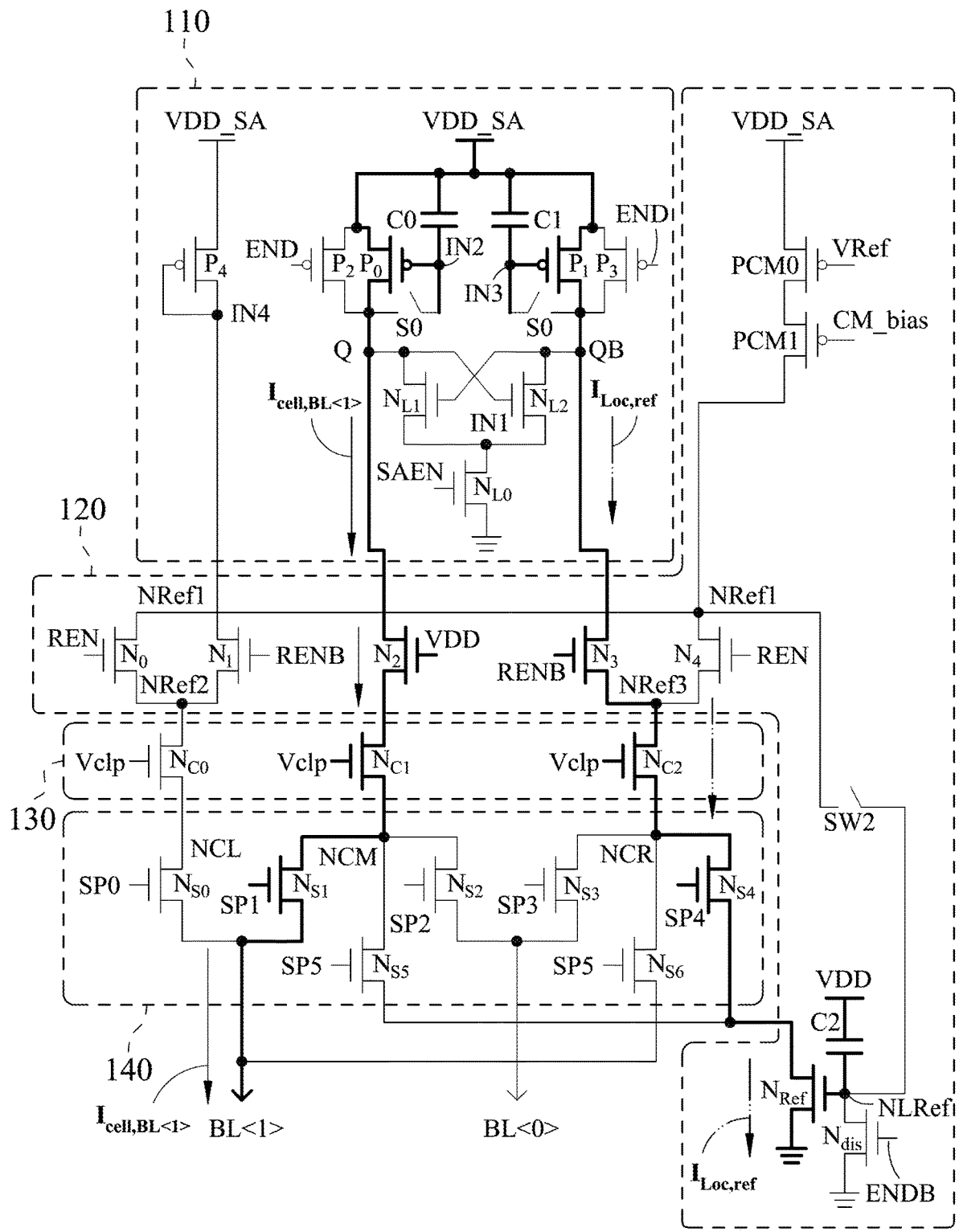
FIG. 9 shows a circuit diagram of a second bit current sampling operation of the sensing method of FIG. 2, during a fifth time interval.
Figure 10:
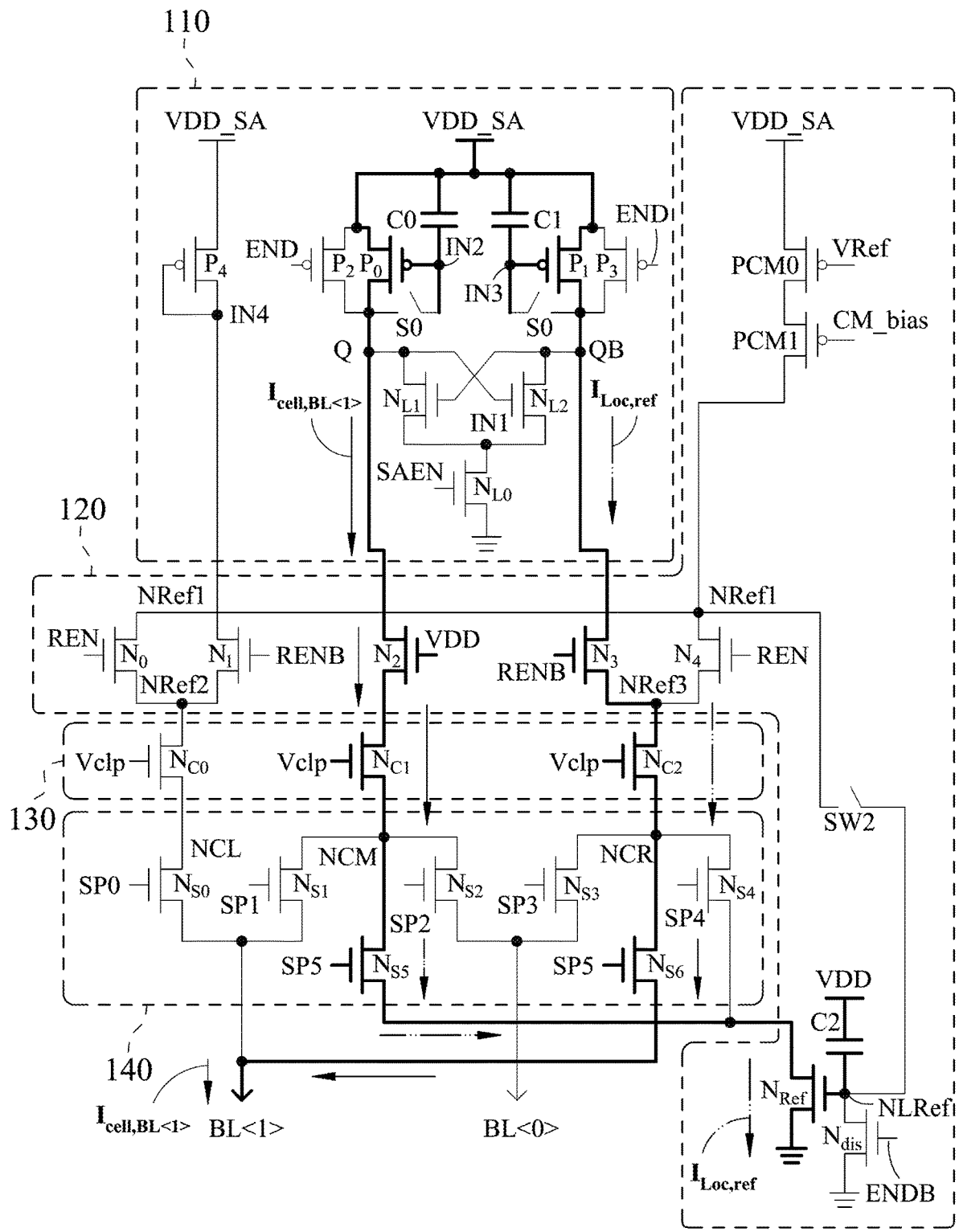
FIG. 10 shows a circuit diagram of a second bit current path swapping operation of the sensing method of FIG. 2, during a sixth time interval.
Figure 11:
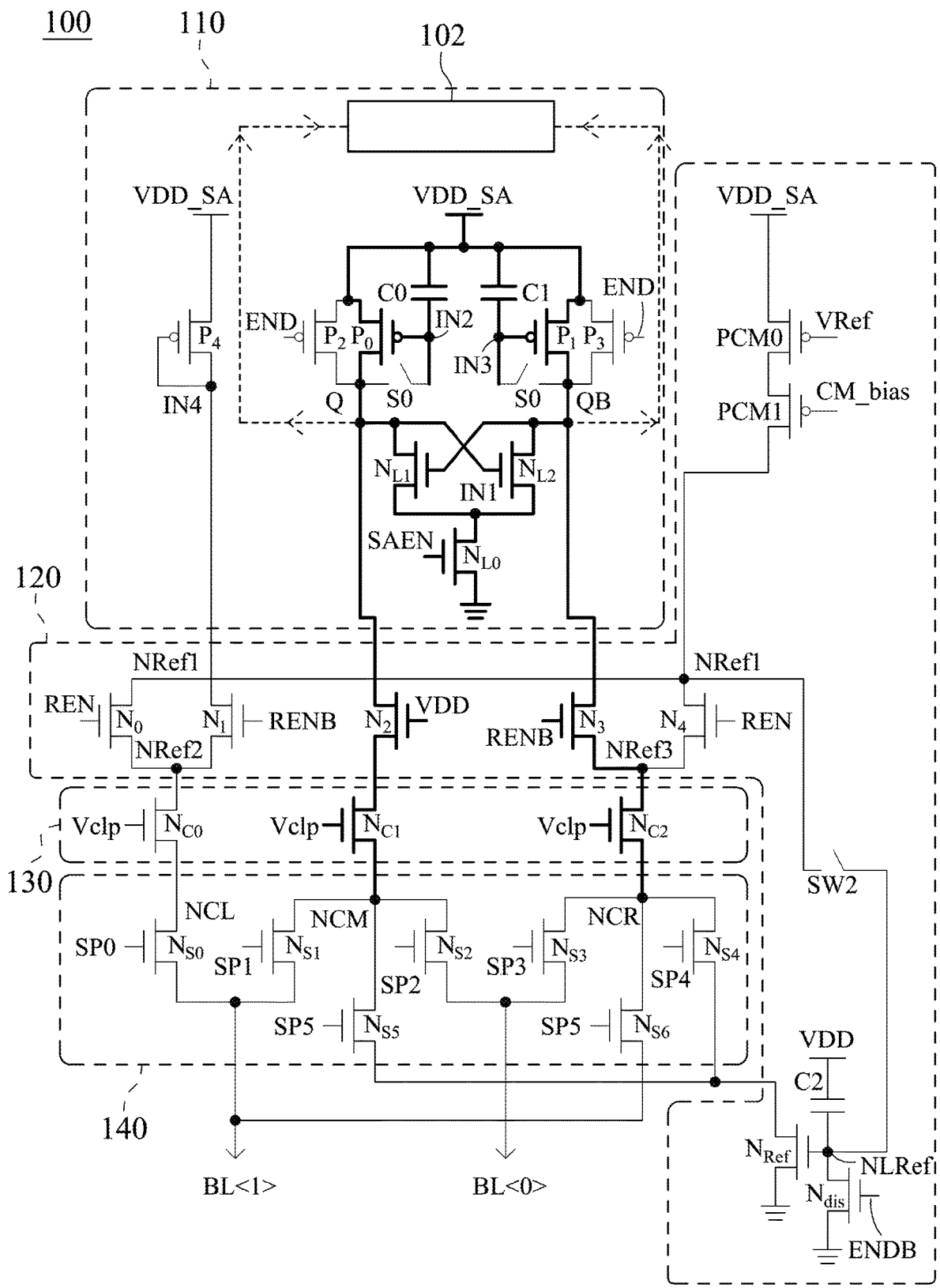
FIG. 11 shows a circuit diagram of a second bit outputting operation of the sensing method of FIG. 2, during a seven time interval.
Figure 12:
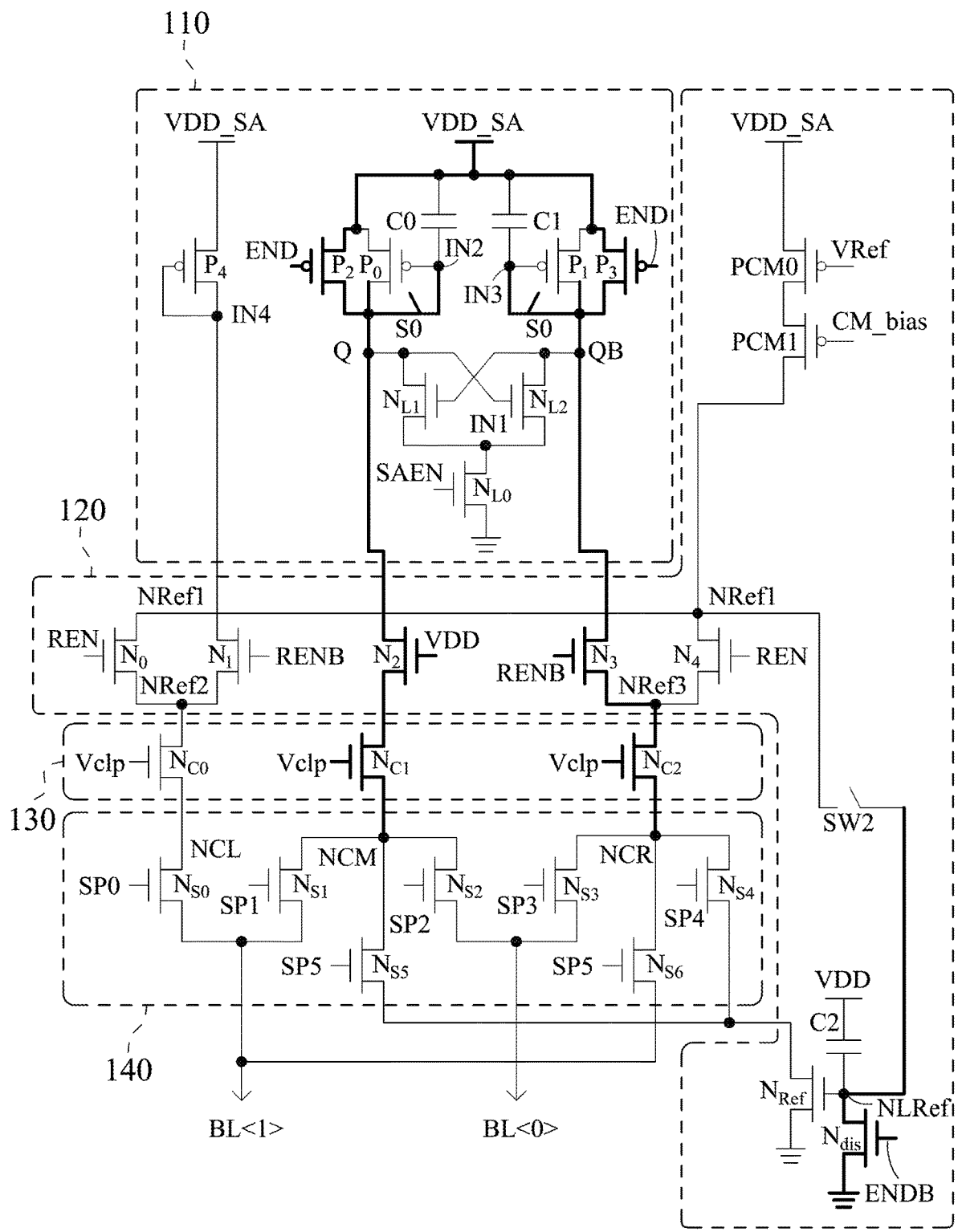
FIG. 12 shows a circuit diagram of a reset operation of the sensing method of FIG. 2, during a standby time interval.
Figure 13:
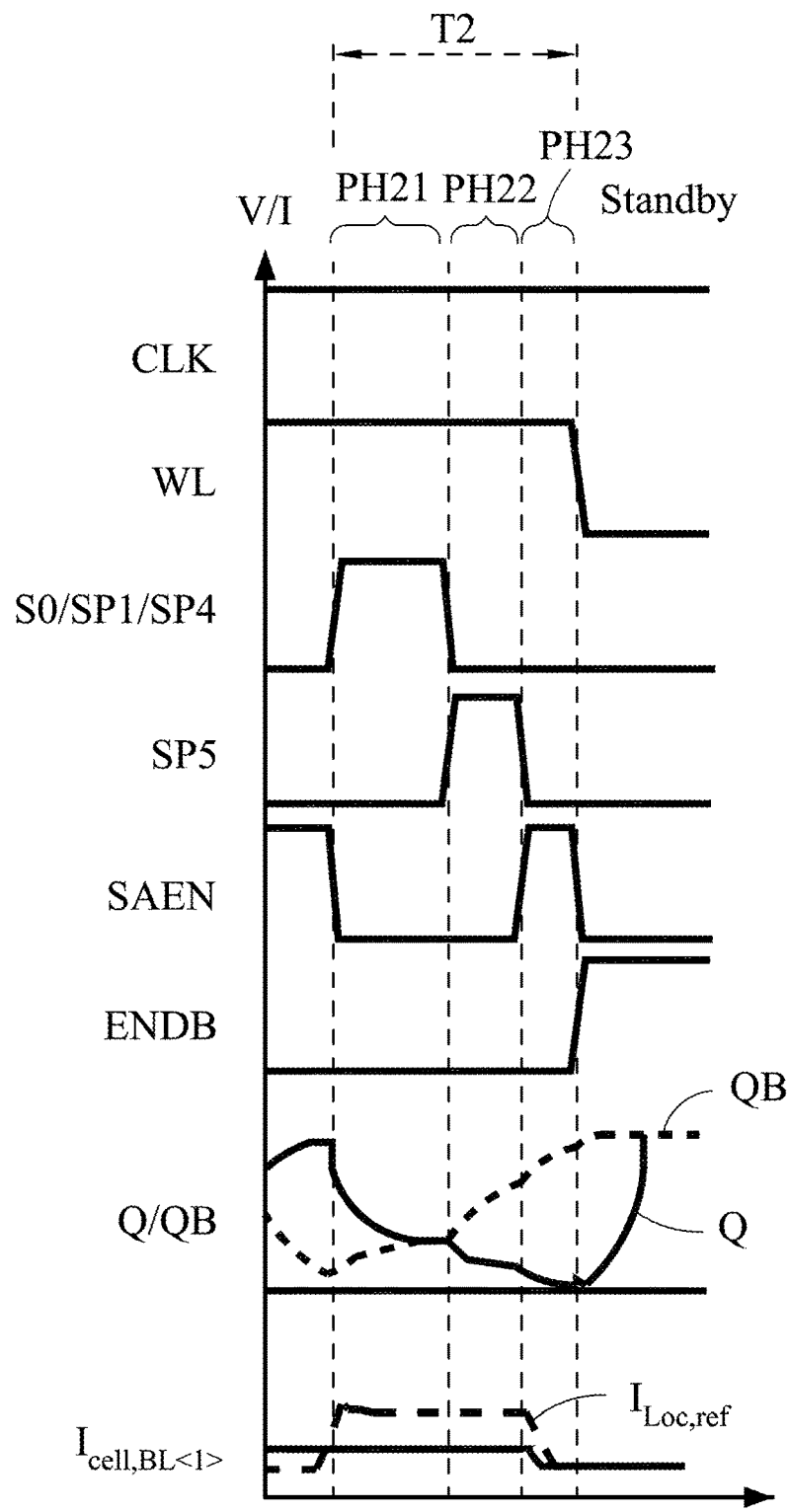
FIG. 13 shows timing diagrams of voltage levels of control signals, the first output node, the second output node and the second bit line current of FIGS. 9-12.

FIG. 2 shows a flow chart of a sensing method 200 of the sensing circuit 100 with adaptive local reference generation of a resistive memory according to another embodiment of the present disclosure. FIG. 3 shows a circuit diagram of a pre-charge operation of the sensing method 200 of FIG. 2, during a first period PH01 of a first time interval PH0. FIG. 4 shows a circuit diagram of a local reference generating operation of the sensing method 200 of FIG. 2, during a second period PH02 of the first time interval PH0. FIG. 5 shows a circuit diagram of a first bit current sampling operation of the sensing method 200 of FIG. 2, during a second time interval PH11. FIG. 6A shows a circuit diagram of a first bit current path switching operation of the sensing method 200 of FIG. 2, during a third time interval PH12. FIG. 6B shows a schematic view of variations of voltage levels VQ, VQB of a first output node Q and a second output node QB of the sensing circuit 100 in the first bit current path switching operation of FIG. 6A, during the third time interval PH12. FIG. 7 shows a circuit diagram of a first bit outputting operation of the sensing method 200 of FIG. 2, during a fourth time interval PH13. FIG. 8 shows timing diagrams of voltage levels of control signals, the first output node Q, the second output node QB, the first bit line current $I_{cell,BL<0>}$ and the second bit line current $I_{cell,BL<1>}$ of FIGS. 3-7. FIG. 9 shows a circuit diagram of a second bit current sampling operation of the sensing method 200 of FIG. 2, during a fifth time interval PH21. FIG. 10 shows a circuit diagram of a second bit current path swapping operation of the sensing method 200 of FIG. 2, during a sixth time interval PH22. FIG. 11 shows a circuit diagram of a second bit outputting operation of the sensing method 200 of FIG. 2, during a seven time interval PH23. FIG. 12 shows a circuit diagram of a reset operation of the sensing method 200 of FIG. 2, during a standby time interval Standby. FIG. 13 shows timing diagrams of voltage levels of control signals, the first output node Q, the second output node QB and the second bit line current $I_{cell,BL<1>}$ of FIGS. 9-12. The sensing method 200 includes a voltage level applying step S12, a first bit line current sensing step S14 and a second bit line current sensing step S16.

The voltage level applying step S12 is for applying a plurality of voltage levels to a plurality of control signals, respectively, and the control signals are configured to control the sensing circuit 100, as shown in FIGS. 1 and 2. In detail, the control signals include a reset signal END, a sense-amplifier switching signal S0, a sense amplifier enable signal SAEN, a reference enable signal REN, an inverse reference enable signal RENB, an inverse reset signal ENDB, a reference control signal VRef, a current mirror bias signal CM_bias, a clamping signal Vclp, a first path switching signal SP0, a second path switching signal SP1, a third path switching signal SP2, a fourth path switching signal SP3, a fifth path switching signal SP4 and a sixth path switching signal SP5. The reset signal END is configured to control the third sense-amplifier transistor $P_2$ and the fourth sense-amplifier transistor $P_3$ of the sense amplifier 110. The sense-amplifier switching signal S0 is configured to control the first sense-amplifier switch and the second sense-amplifier switch of the sense amplifier 110. The sense amplifier enable signal SAEN is configured to control the seventh sense-amplifier transistor $N_{L0}$ of the sense amplifier 110. The reference enable signal REN is configured to control the first reference transistor $N_0$, the fifth reference transistor $N_4$ and the reference switch SW2 of the adaptive local reference generator 120. The inverse reference enable signal RENB is configured to control the second reference transistor $N_1$ and the fourth reference transistor $N_3$ of the adaptive local reference generator 120, and the inverse reference enable signal RENB is equal to an inverse of the reference enable signal REN. The inverse reset signal ENDB is configured to control the reset reference transistor $N_{dis}$ of the adaptive local reference generator 120, and the inverse reset signal ENDB is equal to an inverse of the reset signal END. The reference control signal VRef is configured to control the first current mirror transistor PCM0 of the adaptive local reference generator 120. The current mirror bias signal CM_bias is configured to control the second current mirror transistor PCM1 of the adaptive local reference generator 120. The clamping signal Vclp is configured to control the first clamping transistor $N_{C0}$, the second clamping transistor $N_{C1}$ and the third clamping transistor $N_{C2}$ of the clamping unit 130. The first path switching signal SP0 is configured to control the first switching transistor $N_{S0}$ of the path switching unit 140. The second path switching signal SP1 is configured to control the second switching transistor $N_{S1}$ of the path switching unit 140. The third path switching signal SP2 is configured to control the third switching transistor $N_{S2}$ of the path switching unit 140. The fourth path switching signal SP3 is configured to control the fourth switching transistor $N_{S3}$ of the path switching unit 140. The fifth path switching signal SP4 is configured to control the fifth switching transistor $N_{S4}$ of the path switching unit 140. The sixth path switching signal SP5 is configured to control the sixth switching transistor $N_{S5}$ and the seven switching transistor $N_{S6}$ of the path switching unit 140.

The first bit line current sensing step S14 is for sensing the first bit line current $I_{cell,BL<0>}$ of the first output node Q and the local reference current $I_{Loc,ref}$ of the second output node QB according to the voltage levels of the control signals during the first bit line time interval T1. In other words, the first bit line current $I_{cell,BL<0>}$ flows through the first output node Q during the first bit line time interval T1 via the sense amplifier 110, the adaptive local reference generator 120, the clamping unit 130 and the path switching unit 140. The local reference current $I_{Loc,ref}$ flows through the second output node QB during the first bit line time interval T1 via the sense amplifier 110, the adaptive local reference generator 120, the clamping unit 130 and the path switching unit 140.

In detail, the first bit line time interval T1 is divided into four time intervals, as shown in FIG. 8. The four time intervals include the first time interval PH0, the second time interval PH11, the third time interval PH12 and the fourth time interval PH13, and the first time interval PH0 includes the first period PH01 and the second period PH02, so that there are five operations in the first bit line current sensing step S14. The five operations include the pre-charge operation, the local reference generating operation, the first bit current sampling operation, the first bit current path switching operation and the first bit outputting operation, and are respectively described as follows.

In FIGS. 3 and 8, the pre-charge operation is performed during the first period PH01 of the first time interval PH0 in the first bit line current sensing step S14. A first bit line current path corresponding to the first bit line current $I_{cell,BL<0>}$ is formed by the first sense-amplifier transistor $P_0$ of the sense amplifier 110, the third reference transistor $N_2$ of the adaptive local reference generator 120, the second clamping transistor $N_{C1}$ of the clamping unit 130, the third switching transistor $N_{S2}$ of the path switching unit 140 and the first bit line BL<0>. A second bit line current path corresponding to the second bit line current $I_{cell,BL<1>}$ is formed by the eighth sense-amplifier transistor $P_4$ of the sense amplifier 110, the second reference transistor $N_1$ of the adaptive local reference generator 120, the first clamping transistor $N_{C0}$ of the clamping unit 130, the first switching transistor $N_{S0}$ of the path switching unit 140 and the second bit line BL<1>. A current $I_{P1}$ of the second sense-amplifier transistor $P_1$ of the sense amplifier 110 is equal to zero. Accordingly, the pre-charge operation of the first bit line current sensing step S14 of the present disclosure utilizes removal of a reference current branch to improve sensing performance by reducing energy, peak current and read power.

In FIGS. 4 and 8, the local reference generating operation is performed during the second period PH02 of the first time interval PH0 in the first bit line current sensing step S14. A first bit line current path corresponding to the first bit line current $I_{cell,BL<0>}$ is formed by the first sense-amplifier transistor $P_0$ of the sense amplifier 110, the third reference transistor $N_2$ of the adaptive local reference generator 120, the second clamping transistor $N_{C1}$ of the clamping unit 130, the third switching transistor $N_{S2}$ of the path switching unit 140 and the first bit line BL<0>. A second bit line current path corresponding to the second bit line current $I_{cell,BL<1>}$ is formed by the first reference transistor $N_0$ of the adaptive local reference generator 120, the first clamping transistor $N_{C0}$ of the clamping unit 130, the first switching transistor $N_{S0}$ of the path switching unit 140 and the second bit line BL<1>. The current $I_{P1}$ of the second sense-amplifier transistor $P_1$ of the sense amplifier 110 is equal to zero. A local reference current path corresponding to the local reference current $I_{Loc,ref}$ is formed by the fifth reference transistor $N_4$ of the adaptive local reference generator 120, the third clamping transistor $N_{C2}$ of the clamping unit 130, the fifth switching transistor $N_{S4}$ of the path switching unit 140 and the local reference transistor $N_{Ref}$ of the adaptive local reference generator 120. In addition, the reference current $I_{G\_ref}$ is equal to a sum of the second bit line current $I_{cell,BL<1>}$ and the local reference current $I_{Loc,ref}$. The reference current $I_{G\_ref}$ is equal to a sum of an anti-parallel resistance current $I_{AP,ref}$ and a parallel resistance current $I_{P,ref}$. When the second bit line current $I_{cell,BL<1>}$ is equal to the anti-parallel resistance current $I_{AP,ref}$, the local reference current $I_{Loc,ref}$ is equal to the parallel resistance current $I_{P,ref}$. When the second bit line current $I_{cell,BL<1>}$ is equal to the parallel resistance current $I_{P,ref}$, the local reference current $I_{Loc,ref}$ is equal to the anti-parallel resistance current $I_{AP,ref}$.

In FIGS. 5 and 8, the first bit current sampling operation is performed during the second time interval PH11 in the first bit line current sensing step S14. A first bit line current path corresponding to the first bit line current $I_{cell,BL<0>}$ is formed by the first sense-amplifier transistor $P_0$ of the sense amplifier 110, the third reference transistor $N_2$ of the adaptive local reference generator 120, the second clamping transistor $N_{C1}$ of the clamping unit 130, the third switching transistor $N_{S2}$ of the path switching unit 140 and the first bit line BL<0>. A second bit line current path corresponding to the second bit line current $I_{cell,BL<1>}$ is formed by the eighth sense-amplifier transistor $P_4$ of the sense amplifier 110, the second reference transistor $N_1$ of the adaptive local reference generator 120, the first clamping transistor $N_{C0}$ of the clamping unit 130, the first switching transistor $N_{S0}$ of the path switching unit 140 and the second bit line BL<1>. A local reference current path corresponding to the local reference current $I_{Loc,ref}$ is formed by the second sense-amplifier transistor $P_1$ of the sense amplifier 110, the fourth reference transistor $N_3$ of the adaptive local reference generator 120, the third clamping transistor $N_{C2}$ of the clamping unit 130, the fifth switching transistor $N_{S4}$ of the path switching unit 140 and the local reference transistor $N_{Ref}$ of the adaptive local reference generator 120. The first bit current sampling operation can store a first bit line equivalent voltage corresponding to the first bit line current $I_{cell,BL<0>}$ and a local reference equivalent voltage corresponding to the local reference current $I_{Loc,ref}$ in the first sense-amplifier capacitor C0 and the second sense-amplifier capacitor C1 of the sense amplifier 110, respectively.

In FIGS. 6A, 6B and 8, the first bit current path switching operation is performed during the third time interval PH12 in the first bit line current sensing step S14. Two first bit line current paths corresponding to the first bit line current $I_{cell,BL<0>}$ are formed. One of the two first bit line current paths is formed by the first sense-amplifier transistor $P_0$ of the sense amplifier 110, the third reference transistor $N_2$ of the adaptive local reference generator 120 and the second clamping transistor $N_{C1}$ of the clamping unit 130. Another of the two first bit line current paths is formed by the fourth switching transistor $N_{S3}$ of the path switching unit 140 and the first bit line BL<0>. A second bit line current path corresponding to the second bit line current $I_{cell,BL<1>}$ is formed by the second switching transistor $N_{S1}$ of the path switching unit 140 and the second bit line BL<1>. A local reference current path corresponding to the local reference current $I_{Loc,ref}$ is formed by the second sense-amplifier transistor $P_1$ of the sense amplifier 110, the fourth reference transistor $N_3$ of the adaptive local reference generator 120 and the third clamping transistor $N_{C2}$ of the clamping unit 130. In FIG. 6B, the variations of voltage levels VQ, VQB of the first output node Q and the second output node QB depend on a current $I_{P0}$ of the first sense-amplifier transistor $P_0$, a current $I_{P1}$ of the second sense-amplifier transistor $P_1$, a current $I_{NC1}$ of the second clamping transistor $N_{C1}$ and a current $I_{NC2}$ of the third clamping transistor $N_{C2}$. The current $I_{P0}$ is equal to the current $I_{NC2}$. The current $I_{P1}$ is different from the current $I_{NC1}$. When the current $I_{P1}$ is equal to an anti-parallel resistance current $I_{AP}$, the current $I_{NC1}$ is equal to a parallel resistance current $I_P$. When the current $I_{P1}$ is equal to the parallel resistance current $I_P$, the current $I_{NC1}$ is equal to the anti-parallel resistance current $I_{AP}$. In addition, when the current $I_{P0}$ is different from the current $I_{NC1}$, the voltage level VQ of the first output node Q is changed so as to enhance an effective sensing margin. When the current $I_{P1}$ is different from the current $I_{NC2}$, the voltage level VQB of the second output node QB is changed so as to enhance the effective sensing margin. Accordingly, the first bit current path switching operation of the sensing method 200 of the present disclosure can enhance the effective sensing margin by about 2 times, compared to a conventional sensing method without the first bit current path switching operation.

In FIGS. 7 and 8, the first bit outputting operation is performed during the fourth time interval PH13 in the first bit line current sensing step S14. A second bit line current path corresponding to the second bit line current $I_{cell,BL<1>}$ is formed by the eighth sense-amplifier transistor $P_4$ of the sense amplifier 110, the second reference transistor $N_1$ of the adaptive local reference generator 120, the first clamping transistor $N_{C0}$ of the clamping unit 130, the first switching transistor $N_{S0}$ of the path switching unit 140 and the second bit line BL<1>. The first output node Q and the second output node QB are signally connected to an output latch unit 102. The output latch unit 102 includes a first bit output latch. When the voltage level VQ of the first output node Q is greater than the voltage level VQB of the second output node QB, an output of the first bit output latch of the output latch unit 102 is equal to the power supply voltage VDD. When the voltage level VQ of the first output node Q is smaller than the voltage level VQB of the second output node QB, the output of the first bit output latch of the output latch unit 102 is equal to zero.

The second bit line current sensing step S16 is for sensing the second bit line current $I_{cell,BL<1>}$ of the first output node Q and the local reference current $I_{Loc,ref}$ of the second output node QB according to the voltage levels of the control signals during the second bit line time interval T2. In other words, the second bit line current $I_{cell,BL<1>}$ flows through the first output node Q during a second bit line time interval T2 via the sense amplifier 110, the adaptive local reference generator 120, the clamping unit 130 and the path switching unit 140. The first bit line time interval T1 is different from the second bit line time interval T2. The second bit line time interval T2 follows the first bit line time interval T1. The local reference current $I_{Loc,ref}$ flows through the second output node QB during the second bit line time interval T2 via the sense amplifier 110, the adaptive local reference generator 120, the clamping unit 130 and the path switching unit 140.

In detail, the second bit line time interval T2 is divided into three time intervals, as shown in FIG. 13. The three time intervals include the fifth time interval PH21, the sixth time interval PH22 and the seven time interval PH23, so that there are three operations in the second bit line current sensing step S16. The three operations include the second bit current sampling operation, the second bit current path swapping operation and the second bit outputting operation, and are respectively described as follows.

In FIGS. 9 and 13, the second bit current sampling operation is performed during the fifth time interval PH21 in the second bit line current sensing step S16. A second bit line current path corresponding to the second bit line current $I_{cell,BL<1>}$ is formed by the first sense-amplifier transistor $P_0$ of the sense amplifier 110, the third reference transistor $N_2$ of the adaptive local reference generator 120, the second clamping transistor $N_{C1}$ of the clamping unit 130, the second switching transistor $N_{S1}$ of the path switching unit 140 and the second bit line BL<1>. A local reference current path corresponding to the local reference current $I_{Loc,ref}$ is formed by the second sense-amplifier transistor $P_1$ of the sense amplifier 110, the fourth reference transistor $N_3$ of the adaptive local reference generator 120, the third clamping transistor $N_{C2}$ of the clamping unit 130, the fifth switching transistor $N_{S4}$ of the path switching unit 140 and the local reference transistor $N_{Ref}$ of the adaptive local reference generator 120. The second bit current sampling operation can store a second bit line equivalent voltage corresponding to the second bit line current $I_{cell,BL<1>}$ and a local reference equivalent voltage corresponding to the local reference current $I_{Loc,ref}$ in the first sense-amplifier capacitor C0 and the second sense-amplifier capacitor C1 of the sense amplifier 110, respectively.

In FIGS. 10 and 13, the second bit current path swapping operation is performed during the sixth time interval PH22 in the second bit line current sensing step S16. Two second bit line current paths corresponding to the second bit line current $I_{cell,BL<1>}$ are formed. One of the two second bit line current paths is formed by the first sense-amplifier transistor $P_0$ of the sense amplifier 110, the third reference transistor $N_2$ of the adaptive local reference generator 120 and the second clamping transistor $N_{C1}$ of the clamping unit 130. Another of the two second bit line current paths is formed by the seven switching transistor $N_{S6}$ of the path switching unit 140 and the second bit line BL<1>. Two local reference current paths corresponding to the local reference current $I_{Loc,ref}$ are formed. One of the two local reference current paths is formed by the second sense-amplifier transistor $P_1$ of the sense amplifier 110, the fourth reference transistor $N_3$ of the adaptive local reference generator 120 and the third clamping transistor $N_{C2}$ of the clamping unit 130. Another of the two local reference current paths is formed by the sixth switching transistor $N_{S5}$ of the path switching unit 140 and the local reference transistor $N_{Ref}$ of the adaptive local reference generator 120.

In FIGS. 11 and 13, the second bit outputting operation is performed during the seven time interval PH23 in the second bit line current sensing step S16. The first output node Q and the second output node QB are signally connected to an output latch unit 102. The output latch unit 102 further includes a second bit output latch. When the voltage level VQ of the first output node Q is greater than the voltage level VQB of the second output node QB, an output of the second bit output latch of the output latch unit 102 is equal to the power supply voltage VDD. When the voltage level VQ of the first output node Q is smaller than the voltage level VQB of the second output node QB, the output of the second bit output latch of the output latch unit 102 is equal to zero.

In FIGS. 12 and 13, a reset operation is performed during the standby time interval Standby in the second bit line current sensing step S16. The reset operation resets a voltage level of the fourth reference node NLRef to the ground voltage GND, thereby allowing the sensing circuit 100 to return to an initial state. Accordingly, the sensing method 200 of the present disclosure utilizes one sense amplifier to sense two bit line currents, so that area penalty can be reduced, and it is suitable for a resistive type memory in high bandwidth application.

According to the aforementioned embodiments and examples, the advantages of the present disclosure are described as follows.

1. The sensing circuit with adaptive local reference generation of the resistive memory and the sensing method thereof of the present disclosure utilizes one sense amplifier to sense two bit line currents, so that area penalty can be reduced, and it is suitable for a resistive type memory in high bandwidth application.

2. The pre-charge operation of the sensing method of the present disclosure utilizes removal of a reference current branch to improve sensing performance by reducing energy, peak current and read power.

3. The first bit current path switching operation of the sensing method of the present disclosure can enhance the effective sensing margin by about 2 times, compared to a conventional sensing method without the first bit current path switching operation.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A sensing circuit with adaptive local reference generation of a resistive memory, which is configured to adaptively sense a first bit line current of a first bit line and a second bit line current of a second bit line, and the sensing circuit with adaptive local reference generation of the resistive memory comprising:
    a sense amplifier having a first output node and a second output node;
    an adaptive local reference generator electrically connected to the sense amplifier and generating a reference current equal to a sum of the second bit line current and a local reference current;
    a clamping unit electrically connected to the adaptive local reference generator; and
    a path switching unit electrically connected to the clamping unit, the adaptive local reference generator, the first bit line and the second bit line;
    wherein the first bit line current flows through the first output node during a first bit line time interval via the sense amplifier, the adaptive local reference generator, the clamping unit and the path switching unit, the second bit line current flows through the first output node during a second bit line time interval via the sense amplifier, the adaptive local reference generator, the clamping unit and the path switching unit, the first bit line time interval is different from the second bit line time interval, and the local reference current flows through the second output node during the first bit line time interval and the second bit line time interval via the sense amplifier, the adaptive local reference generator, the clamping unit and the path switching unit.

2. The sensing circuit with adaptive local reference generation of the resistive memory of claim 1, wherein the sense amplifier further has a first inner node, a second inner node and a third inner node, and the sense amplifier comprises:
    a first sense-amplifier transistor connected between a sense-amplifier power supply voltage and the first output node;
    a second sense-amplifier transistor connected between the sense-amplifier power supply voltage and the second output node;
    a third sense-amplifier transistor connected between the sense-amplifier power supply voltage and the first output node;
    a fourth sense-amplifier transistor connected between the sense-amplifier power supply voltage and the second output node;
    a fifth sense-amplifier transistor connected between the first output node and the first inner node;
    a sixth sense-amplifier transistor connected between the second output node and the first inner node;
    a seventh sense-amplifier transistor connected between the first inner node and a ground voltage;
    a first sense-amplifier capacitor coupled between the sense-amplifier power supply voltage and the second inner node;
    a second sense-amplifier capacitor coupled between the sense-amplifier power supply voltage and the second inner node;
    a first sense-amplifier switch coupled between the second inner node and the first output node; and
    a second sense-amplifier switch coupled between the second inner node and the second output node.

3. The sensing circuit with adaptive local reference generation of the resistive memory of claim 2, wherein the sense amplifier further has a fourth inner node, and the sense amplifier further comprises:
    an eighth sense-amplifier transistor connected between the sense-amplifier power supply voltage and the fourth inner node.

4. The sensing circuit with adaptive local reference generation of the resistive memory of claim 1, wherein the adaptive local reference generator has a first reference node, a second reference node and a third reference node, and the adaptive local reference generator comprises:
    a first reference transistor connected between the first reference node and the second reference node;
    a second reference transistor connected between the sense amplifier and the second reference node;
    a third reference transistor connected between the sense amplifier and the clamping unit;
    a fourth reference transistor connected between the sense amplifier and the third reference node; and
    a fifth reference transistor connected between the first reference node and the third reference node.

5. The sensing circuit with adaptive local reference generation of the resistive memory of claim 4, wherein the adaptive local reference generator further comprises:
    a first current mirror transistor connected to the sense-amplifier power supply voltage; and
    a second current mirror transistor connected between the first current mirror transistor and the first reference node;
    wherein the first current mirror transistor and the second current mirror transistor are configured to generate the reference current.

6. The sensing circuit with adaptive local reference generation of the resistive memory of claim 4, wherein the adaptive local reference generator further has a fourth reference node, and the adaptive local reference generator further comprises:
- a reference switch coupled between the first reference node and the fourth reference node;
- a reference capacitor coupled between the power supply voltage and the fourth reference node;
- a reset reference transistor connected between the fourth reference node and a ground voltage; and
- a local reference transistor connected to the fourth reference node.

7. The sensing circuit with adaptive local reference generation of the resistive memory of claim 6, wherein the first reference transistor, the fifth reference transistor and the reference switch are controlled by a reference enable signal, the second reference transistor and the fourth reference transistor are controlled by an inverse reference enable signal, the third reference transistor is controlled by a power supply voltage, the reset reference transistor is controlled by an inverse reset signal, and the local reference transistor is controlled by the fourth reference node.

8. The sensing circuit with adaptive local reference generation of the resistive memory of claim 4, wherein the clamping unit comprises:
- a first clamping transistor connected between the second reference node and the path switching unit;
- a second clamping transistor connected between the third reference transistor and the path switching unit; and
- a third clamping transistor connected between the third reference node and the path switching unit.

9. The sensing circuit with adaptive local reference generation of the resistive memory of claim 8, wherein the path switching unit has a left switching node connected to the first clamping transistor, a middle switching node connected to the second clamping transistor and a right switching node connected to the third clamping transistor, and the path switching unit comprises:
- a first switching transistor connected between the left switching node and the second bit line;
- a second switching transistor connected between the middle switching node and the second bit line;
- a third switching transistor connected between the middle switching node and the first bit line;
- a fourth switching transistor connected between the right switching node and the first bit line;
- a fifth switching transistor connected between the right switching node and the adaptive local reference generator;
- a sixth switching transistor connected between the middle switching node and the adaptive local reference generator; and
- a seventh switching transistor connected between the right switching node and the second bit line.

10. A sensing method of the sensing circuit with adaptive local reference generation of a resistive memory of claim 1, comprising:
- providing a voltage level applying step, wherein the voltage level applying step is for applying a plurality of voltage levels to a plurality of control signals, respectively, and the control signals are configured to control the sensing circuit;
- providing a first bit line current sensing step, wherein the first bit line current sensing step is for sensing the first bit line current of the first output node and the local reference current of the second output node according to the voltage levels of the control signals during the first bit line time interval; and
- providing a second bit line current sensing step, wherein the second bit line current sensing step is for sensing the second bit line current of the first output node and the local reference current of the second output node according to the voltage levels of the control signals during the second bit line time interval.

11. The sensing method of claim 10, wherein,
in the voltage level applying step, the control signals comprise a reset signal, a sense-amplifier switching signal, a sense amplifier enable signal, a reference enable signal, an inverse reference enable signal, an inverse reset signal, a clamping signal, a first path switching signal, a second path switching signal, a third path switching signal, a fourth path switching signal, a fifth path switching signal and a sixth path switching signal;
the reset signal is configured to control a third sense-amplifier transistor and a fourth sense-amplifier transistor of the sense amplifier;
the sense-amplifier switching signal is configured to control a first sense-amplifier switch and a second sense-amplifier switch of the sense amplifier;
the sense amplifier enable signal is configured to control a seventh sense-amplifier transistor of the sense amplifier;
the reference enable signal is configured to control a first reference transistor, a fifth reference transistor and a reference switch of the adaptive local reference generator;
the inverse reference enable signal is configured to control a second reference transistor and a fourth reference transistor of the adaptive local reference generator, and the inverse reference enable signal is equal to an inverse of the reference enable signal;
the inverse reset signal is configured to control a reset reference transistor of the adaptive local reference generator, and the inverse reset signal is equal to an inverse of the reset signal;
the clamping signal is configured to control a first clamping transistor, a second clamping transistor and a third clamping transistor of the clamping unit;
the first path switching signal is configured to control a first switching transistor of the path switching unit;
the second path switching signal is configured to control a second switching transistor of the path switching unit;
the third path switching signal is configured to control a third switching transistor of the path switching unit;
the fourth path switching signal is configured to control a fourth switching transistor of the path switching unit;
the fifth path switching signal is configured to control a fifth switching transistor of the path switching unit; and
the sixth path switching signal is configured to control a sixth switching transistor and a seven switching transistor of the path switching unit.

12. The sensing method of claim 10, wherein during a first period of a first time interval in the first bit line current sensing step,
- a first bit line current path is formed by a first sense-amplifier transistor of the sense amplifier, a third reference transistor of the adaptive local reference generator, a second clamping transistor of the clamping unit, a third switching transistor of the path switching unit and the first bit line;
- a second bit line current path is formed by an eighth sense-amplifier transistor of the sense amplifier, a second reference transistor of the adaptive local reference generator, a first clamping transistor of the clamping unit, a first switching transistor of the path switching unit and the second bit line; and a current of a second sense-amplifier transistor of the sense amplifier is equal to zero.

13. The sensing method of claim 10, wherein during a second period of a first time interval in the first bit line current sensing step, a first bit line current path is formed by a first sense-amplifier transistor of the sense amplifier, a third reference transistor of the adaptive local reference generator, a second clamping transistor of the clamping unit, a third switching transistor of the path switching unit and the first bit line;

a second bit line current path is formed by a first reference transistor of the adaptive local reference generator, a first clamping transistor of the clamping unit, a first switching transistor of the path switching unit and the second bit line;

a current of a second sense-amplifier transistor of the sense amplifier is equal to zero; and a local reference current path is formed by a fifth reference transistor of the adaptive local reference generator, a third clamping transistor of the clamping unit, a fifth switching transistor of the path switching unit and a local reference transistor of the adaptive local reference generator.

14. The sensing method of claim 13, wherein the reference current is equal to a sum of an anti-parallel resistance current and a parallel resistance current;

when the second bit line current is equal to the anti-parallel resistance current, the local reference current is equal to the parallel resistance current; and when the second bit line current is equal to the parallel resistance current, the local reference current is equal to the anti-parallel resistance current.

15. The sensing method of claim 10, wherein during a second time interval in the first bit line current sensing step, a first bit line current path is formed by a first sense-amplifier transistor of the sense amplifier, a third reference transistor of the adaptive local reference generator, a second clamping transistor of the clamping unit, a third switching transistor of the path switching unit and the first bit line;

a second bit line current path is formed by an eighth sense-amplifier transistor of the sense amplifier, a second reference transistor of the adaptive local reference generator, a first clamping transistor of the clamping unit, a first switching transistor of the path switching unit and the second bit line; and a local reference current path is formed by a second sense-amplifier transistor of the sense amplifier, a fourth reference transistor of the adaptive local reference generator, a third clamping transistor of the clamping unit, a fifth switching transistor of the path switching unit and a local reference transistor of the adaptive local reference generator.

16. The sensing method of claim 10, wherein during a third time interval in the first bit line current sensing step, two first bit line current paths are formed, one of the two first bit line current paths is formed by a first sense-amplifier transistor of the sense amplifier, a third reference transistor of the adaptive local reference generator and a second clamping transistor of the clamping unit, and another of the two first bit line current paths is formed by a fourth switching transistor of the path switching unit and the first bit line;

a second bit line current path is formed by a second switching transistor of the path switching unit and the second bit line; and a local reference current path is formed by a second sense-amplifier transistor of the sense amplifier, a fourth reference transistor of the adaptive local reference generator and a third clamping transistor of the clamping unit.

17. The sensing method of claim 10, wherein during a fourth time interval in the first bit line current sensing step, a second bit line current path is formed by an eighth sense-amplifier transistor of the sense amplifier, a second reference transistor of the adaptive local reference generator, a first clamping transistor of the clamping unit, a first switching transistor of the path switching unit and the second bit line; and the first output node and the second output node are signally connected to an output latch unit, when the voltage level of the first output node is greater than the voltage level of the second output node, an output of the output latch unit is equal to a power supply voltage, and when the voltage level of the first output node is smaller than the voltage level of the second output node, the output of the output latch unit is equal to zero.

18. The sensing method of claim 10, wherein during a fifth time interval in the second bit line current sensing step, a second bit line current path is formed by a first sense-amplifier transistor of the sense amplifier, a third reference transistor of the adaptive local reference generator, a second clamping transistor of the clamping unit, a second switching transistor of the path switching unit and the second bit line; and a local reference current path is formed by a second sense-amplifier transistor of the sense amplifier, a fourth reference transistor of the adaptive local reference generator, a third clamping transistor of the clamping unit, a fifth switching transistor of the path switching unit and a local reference transistor of the adaptive local reference generator.

19. The sensing method of claim 10, wherein during a sixth time interval in the second bit line current sensing step, two second bit line current paths are formed, one of the two second bit line current paths is formed by a first sense-amplifier transistor of the sense amplifier, a third reference transistor of the adaptive local reference generator and a second clamping transistor of the clamping unit, and another of the two second bit line current paths is formed by a seven switching transistor of the path switching unit and the second bit line;

two local reference current paths are formed, one of the two local reference current paths is formed by a second sense-amplifier transistor of the sense amplifier, a fourth reference transistor of the adaptive local reference generator and a third clamping transistor of the clamping unit, and another of the two local reference current paths is formed by a sixth switching transistor of the path switching unit and a local reference transistor of the adaptive local reference generator.

20. The sensing method of claim 10, wherein during a seven time interval in the second bit line current sensing step, the first output node and the second output node are signally connected to an output latch unit;

when a voltage level of the first output node is greater than a voltage level of the second output node, an output of the output latch unit is equal to a power supply voltage; and when the voltage level of the first output node is smaller than the voltage level of the second output node, the output of the output latch unit is equal to zero.

\* \* \* \* \*